US008101336B2

(12) United States Patent
Itoh et al.

(10) Patent No.: US 8,101,336 B2
(45) Date of Patent: Jan. 24, 2012

(54) PHOTOCURABLE AND THERMOSETTING RESIN COMPOSITION, CURED PRODUCT THEREOF, AND PRINTED CIRCUIT BOARD

(75) Inventors: Nobuhito Itoh, Hiki-gun (JP); Yoko Shibasaki, Hiki-gun (JP); Kenji Kato, Hiki-gun (JP); Masao Arima, Hiki-gun (JP)

(73) Assignee: Taiyo Ink Mfg. Co., Ltd., Tokyo (JP)

( * ) Notice: Subject to any disclaimer, the term of this patent is extended or adjusted under 35 U.S.C. 154(b) by 523 days.

(21) Appl. No.: 12/195,793

(22) Filed: Aug. 21, 2008

(65) Prior Publication Data
US 2008/0308301 A1 Dec. 18, 2008

Related U.S. Application Data

(63) Continuation of application No. PCT/JP2007/072218, filed on Nov. 15, 2007.

(30) Foreign Application Priority Data

Nov. 15, 2006 (JP) .................................. 2006-309105
Oct. 1, 2007 (JP) ..................... PCT/JP2007/069219

(51) Int. Cl.
G03F 7/00 (2006.01)
G03F 7/004 (2006.01)
G03F 7/028 (2006.01)
G03F 7/027 (2006.01)

(52) U.S. Cl. .................... 430/281.1; 430/270.1; 430/913

(58) Field of Classification Search ............... 430/270.1, 430/913, 281.1
See application file for complete search history.

(56) References Cited

U.S. PATENT DOCUMENTS

| 6,051,367 | A  | * | 4/2000  | Kunita et al. ............... 430/281.1 |
| 7,112,616 | B2 | * | 9/2006  | Takizawa et al. .................. 522/8 |
| 7,341,828 | B2 | * | 3/2008  | Katoh et al. ............. 430/270.11 |
| 7,462,653 | B2 | * | 12/2008 | Kakinuma et al. ............ 522/100 |
| 7,582,410 | B2 | * | 9/2009  | Sugasaki ..................... 430/271.1 |
| 7,696,257 | B2 | * | 4/2010  | Akutsu et al. .................... 522/16 |
| 2003/0215746 | A1 | * | 11/2003 | Kohiyama et al. ......... 430/280.1 |
| 2005/0215656 | A1 | * | 9/2005  | Kojima et al. .................. 522/29 |
| 2008/0227883 | A1 | * | 9/2008  | Kojima et al. .................. 522/18 |
| 2009/0194319 | A1 | * | 8/2009  | Itoh et al. ...................... 174/250 |

(Continued)

FOREIGN PATENT DOCUMENTS

JP 60-4502 A 1/1985

(Continued)

OTHER PUBLICATIONS

U.S. Appl. No. 12/240,660, filed Sep. 29, 2008, Shibasaki, et al.

(Continued)

*Primary Examiner* — Amanda C. Walke
(74) *Attorney, Agent, or Firm* — Oblon, Spivak, McClelland, Maier & Neustadt, L.L.P.

(57) ABSTRACT

The present invention provides a photocurable and thermosetting resin composition having excellent surface curability and deep curability, allowing pattern formation with a laser beam having a wavelength of 350 to 410 nm, and being useful as a solder resist for laser direct imaging, the composition including a carboxylic resin (A), an oxime ester-based photopolymerization initiator (B) such as 2-(acetyloxyiminomethyl)thioxanthene-9-one, and another photopolymerization initiator than (B) such as 2,4,6-trimethylbenzoyl-diphenylphosphine oxide, and a sulfur compound (E) such as 2-mercaptobenzothiazole.

13 Claims, 1 Drawing Sheet

Schematic view of shape of Grade A
A

Schematic view of shape of Grade B
B

Schematic view of shape of Grade C
C

Schematic view of shape of Grade D
D

Schematic view of shape of Grade E
E

U.S. PATENT DOCUMENTS

2010/0247797 A1* 9/2010 Umebayashi .................. 427/511
2010/0261815 A1* 10/2010 Cho et al. ......................... 524/89

FOREIGN PATENT DOCUMENTS

| | | |
|---|---|---|
| JP | 2001-235858 | 8/2001 |
| JP | 2006-010793 | 1/2006 |
| JP | 2006-071890 | 3/2006 |
| JP | 2006-155942 A | 6/2006 |
| JP | 2006-309157 A | 11/2006 |
| JP | 2007-33467 A | 2/2007 |
| JP | 2007-56221 A | 3/2007 |
| JP | 2007-199665 A | 8/2007 |
| JP | 2007-219362 A | 8/2007 |
| JP | 2007-246586 A | 9/2007 |
| JP | 2008-233517 A | 10/2008 |
| JP | 2009-42751 A | 2/2009 |
| JP | 2009-75284 A | 4/2009 |
| JP | 2009-84457 A | 4/2009 |
| WO | WO 02/096969 | 12/2002 |
| WO | WO 2006/043638 A | 4/2006 |
| WO | WO 2006129697 A1 * | 12/2006 |

OTHER PUBLICATIONS

U.S. Appl. No. 12/249,981, filed Oct. 13, 2008, Itoh, et al.
U.S. Appl. No. 12/389,987, filed Feb. 20, 2009, Itoh, et al.
Japanese Office Action issued Feb. 1, 2011, in Patent Application No. 2008-525296 with English Translation.

* cited by examiner

Schematic view of shape of Grade A
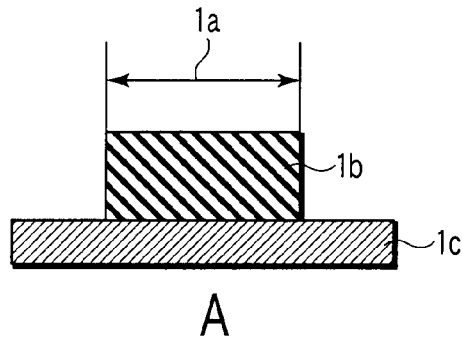
A
Schematic view of shape of Grade B
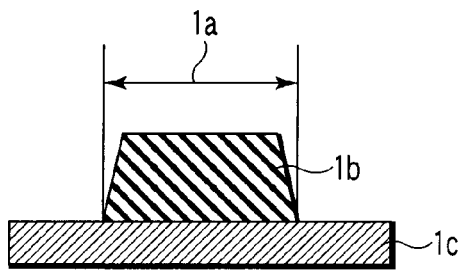
B
Schematic view of shape of Grade C
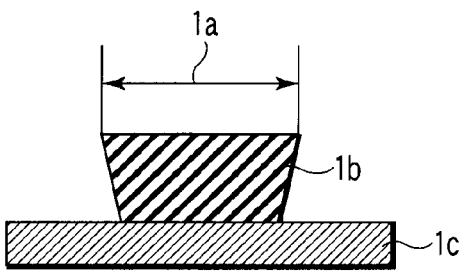
C
Schematic view of shape of Grade D
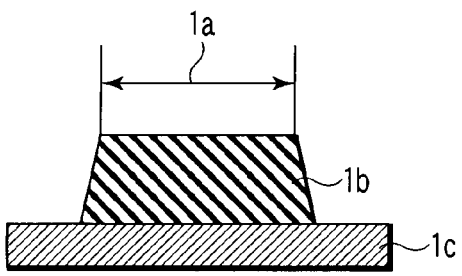
D
Schematic view of shape of Grade E
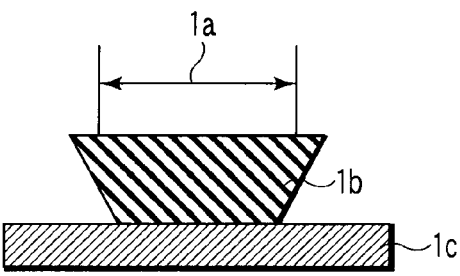
E
FIGURE

PHOTOCURABLE AND THERMOSETTING RESIN COMPOSITION, CURED PRODUCT THEREOF, AND PRINTED CIRCUIT BOARD

CROSS-REFERENCE TO RELATED APPLICATIONS

This is a Continuation Application of PCT Application No. PCT/JP2007/072218, filed Nov. 15, 2007, which was published under PCT Article 21 (2) in Japanese.

This application is based upon and claims the benefit of priority from prior Japanese Patent Applications No. 2006-309105, filed Nov. 15, 2006; and International Application No. PCT/JP2007/069219, filed Oct. 1, 2007, the entire contents of both of which are incorporated herein by reference.

BACKGROUND OF THE INVENTION

1. Field of the Invention

The present invention relates to a photocurable and thermosetting resin composition useful for, in particular, solder resists for direct laser imaging, and also relates to a cured product of the photocurable and thermosetting resin composition, and a printed circuit board patterned using the same.

2. Description of the Related Art

In order to insure the accuracy of positioning in the formation of a solder resist on a printed circuit board, laser direct imaging technique for directly drawing an image by laser according to CAD data has been drawing attention. However, commercially available solder resists require very high exposure energy from 200 to 500 mJ, and thus require much time for direct imaging exposure.

In order to solve the problem, photopolymerization initiators having a high photopolymerization capability, and compositions containing the photopolymerization initiators have been proposed (for example, see Patent Document 1: Jpn. Pat. Appln. KOKAI Publication No. 2001-235858 and Patent Document 2: International Publication No. WO02/096969). By these techniques, a sufficient photopolymerization capability is provided even with bright lines from 350 to 370 nm. However, the rate of photopolymerization is so high that the deep and surface curability are not sufficient. In addition, deactivation of the photopolymerization initiator on the circuit by heat treatment causes striking deterioration of the sensitivity, which results in ablation on the copper circuit.

BRIEF SUMMARY OF THE INVENTION

The present invention is intended to provide a photocurable and thermosetting resin composition which provides a high photopolymerization capability and sufficient deep curability upon irradiation with ultraviolet light or a laser beam, and has excellent thermal stability, the photocurable and thermosetting resin composition being useful solder resists for direct laser imaging. The present invention is also intended to provide a cured product of the photocurable and thermosetting resin composition, and a printed circuit board patterned using the same.

In order to achieve the object, the inventors focused attention on sulfur compounds having a mercapto group (—SH), which is known as a chain transferring agent (see Patent Document 3: Jpn. Pat. Appln. KOKAI Publication No. 2006-010793 and Patent Document 4: Jpn. Pat. Appln. KOKAI Publication No. 2006-071890). However, it was found that a solder resist composed of the composition containing the sulfur compound rapidly reacts with copper to remain as development residues in the portions which must be removed by development. Then, the inventors further studied keenly, and have found that the sulfur compound having a mercapto group (—SH) exhibits poor reactivity of the mercapto group and is stable at the copper interface when the photopolymerization initiator is the combination of an oxime ester-based photopolymerization initiator with other photopolymerization initiator such as a phosphine oxide-based photopolymerization initiator, which reduces the deactivation and ablation of the oxime compound by heat and contact with copper, and produces a coating film having excellent adhesiveness thereby improving the properties of electroless gold plating and the like.

The present invention has been made on the basis of the above-described findings, and is composed of the following aspects.

(1) A photocurable and thermosetting resin composition developable with a dilute alkaline solution, comprising:

a carboxylic resin (A);

an oxime ester-based photopolymerization initiator (B) containing the oxime ester group expressed by the general formula (I):

[Chem 1]

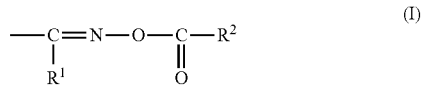

wherein $R^1$ represents a hydrogen atom, an alkyl group having 1 to 7 carbon atoms, or a phenyl group, $R^2$ represents an alkyl group having 1 to 7 carbon atoms, or a phenyl group;

another photopolymerization initiator (C) than (B);

a compound (D) having two or more ethylenically unsaturated groups within one molecule thereof; and a sulfur compound (E) expressed by the general formula (II):

[Chem 2]

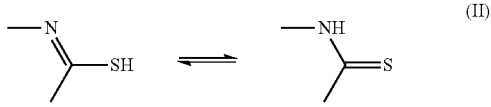

(2) The photocurable and thermosetting resin composition described in (1) developable with a dilute alkaline solution, wherein the photopolymerization initiator (C) comprises one or a mixture of two or more compounds selected from the group consisting of the amino acetophenone-based photopolymerization initiator containing the structure expressed by the general formula (III), and the acylphosphine oxide-based photopolymerization initiator expressed by the general formula (IV):

[Chem 3]

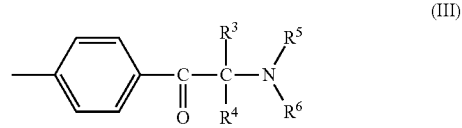

-continued

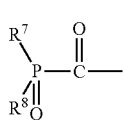
(IV)

wherein $R^3$ and $R^4$ each independently represent an alkyl group or arylalkyl group having 1 to 12 carbon atoms, $R^5$ and $R^6$ each independently represent a hydrogen atom, an alkyl group having 1 to 6 carbon atoms, or $R^5$ and $R^6$ may be linked together to form a cyclic alkyl ether group, and $R^7$ and $R^8$ each independently represent a linear or branched alkyl group having 1 to 10 carbon atoms, a cyclohexyl group, a cyclopentyl group, an aryl group which may be substituted with a halogen atom, an alkyl group, or an alkoxy group, or R—C(=O)— group wherein R is a hydrocarbon group having 1 to 20 carbon atoms; the case where both of $R^7$ and $R^8$ are R—C(=O)— groups is excluded.

(3) The photocurable and thermosetting resin composition described in (1), wherein the oxime ester-based photopolymerization initiator (B) is expressed by the formula (V):

[Chem 4]

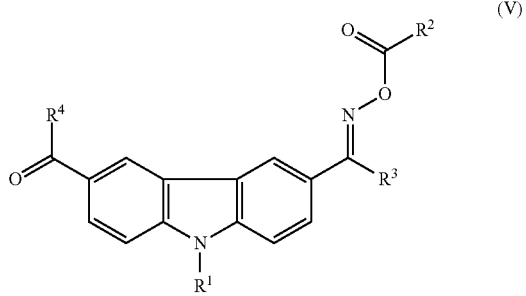
(V)

wherein $R^1$ represents an a hydrogen atom, a halogen atom, an alkyl group having 1 to 12 carbon atoms, a cyclopentyl group, a cyclohexyl group, a phenyl group, a benzyl group, a benzoyl group, an alkanoyl group having 2 to 12 carbon atoms, an alkoxycarbonyl group having 2 to 12 carbon atoms (when the alkyl group composing the alkoxyl group has 2 or more carbon atoms, the alkyl group may be substituted with one or more hydroxy groups, and may have one or more oxygen atoms in the alkyl chain), or a phenoxycarbonyl group;

$R^2$ and $R^4$ each independently represent a phenyl group which may be substituted with an alkyl group having 1 to 6 carbon atoms, a phenyl group, or a halogen atom, an alkyl group having 1 to 20 carbon atoms which may be substituted with one or more hydroxy groups, and may have one or more oxygen atoms in the alkyl chain, a cycloalkyl group having 5 to 8 carbon atoms, an alkanoyl group having 2 to 20 carbon atoms, or a benzoyl group which may be substituted with an alkyl group having 1 to 6 carbon atoms or a phenyl group; and $R^3$ represents a hydrogen atom, a phenyl group which may be substituted with an alkyl group having 1 to 6 carbon atoms, a phenyl group, or a halogen atom, an alkyl group having 1 to 20 carbon atoms which may be substituted with one or more hydroxy groups and may have one or more oxygen atoms in the alkyl chain, a cycloalkyl group having 5 to 8 carbon atoms, an alkanoyl group having 2 to 20 carbon atoms, or a benzoyl group which may be substituted with an alkyl group having 1 to 6 carbon atoms or a phenyl group.

(4) The photocurable and thermosetting resin composition described in (1), wherein the oxime ester-based photopolymerization initiator (B) is expressed by the general formula (VI):

[Chem 5]

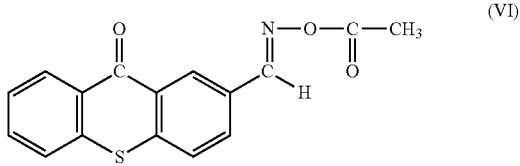
(VI)

(5) The photocurable and thermosetting resin composition described in (1), further comprising a thermosetting component (G).

(6) The photocurable and thermosetting resin composition described in (1), wherein absorbance per 25 μm thickness of a dry coating film is from 0.4 to 1.2 upon irradiation with a light source.

(7) The photocurable and thermosetting resin composition described in (1), which is curable with a laser emission source having a maximum wavelength of 350 to 410 nm.

(8) A photocurable and thermosetting dry film obtained by applying the photocurable and thermosetting resin composition described in (1) to a carrier film, followed by drying.

(9) A cured product obtained by optically curing a dry film of the photocurable and thermosetting resin composition described in (1) on copper.

(10) A cured product obtained by optically curing the dry film described in (8) on copper.

(11) A cured product obtained by optically curing the photocurable and thermosetting resin composition described in (1) with a laser emission source.

(12) A cured product obtained by optically curing the dry film described in (8) with a laser emission source.

(13) A printed circuit board obtained by optically curing the photocurable and thermosetting resin composition described in (1) with a laser beam having a maximum wavelength of 350 to 410 nm, and then thermosetting the cured product.

(14) A printed circuit board obtained by optically curing the dry film described in (1) with a laser beam having a maximum wavelength of 350 to 410 nm, and then thermosetting the cured product.

The present invention achieves the following effects through the above-described aspects.

The photocurable and thermosetting resin composition of the present invention exhibits excellent photocurability to a laser emission source having a maximum wavelength of 350 to 420 nm, and thus can be exposed with a laser direct imaging apparatus. The use of the apparatus prevents position aberration which has been caused by stretching of the photomask or glass substrate during exposure by the known method, causes no pattern defect due to contaminants on the photomask, and allows highly reliable development.

In addition, the use of the laser direct imaging apparatus dispenses with a photomask, facilitates the transfer from design to production, and reduces the defect ratio thereby decreasing the production cost.

In particular, a solder resist which provides excellent deep curability, forms a sectional shape as designed, and has excellent surface curability, thermal stability, and absorbance is provided through the use of the combination of an oxime ester-based photopolymerization initiator and a phosphine oxide-based photopolymerization initiator, and the sulfur compound according to the present invention.

BRIEF DESCRIPTION OF THE SEVERAL VIEWS OF THE DRAWING

The single FIGURE shows schematic views of the sectional shapes of resin compositions obtained through exposure and development, and A to E show the shapes of different grades.

DETAILED DESCRIPTION OF THE INVENTION

The components of the photocurable and thermosetting resin composition of the present invention will be described in detail below.

(A) Carboxylic Resin

The carboxylic resin (A) contained in the photocurable and thermosetting resin composition of the present invention may be a known and widely used resin compound having a carboxyl group in the molecule thereof. From the viewpoint of the photocurability and resistance to development, a carboxylic photosensitive resin (A') having ethylenically unsaturated double bonds in the molecule thereof is more preferable. Specific examples of the carboxylic resin include, but not limited to, the followings:

(1) a carboxylic copolymer resin obtained by the copolymerization of an unsaturated carboxylic acid such as (meth)acrylic acid with one or more other compounds having an unsaturated double bond;

(2) a carboxylic photosensitive copolymer resin obtained by adding a ethylenically unsaturated group of a compound, such as a compound having an epoxy group and an unsaturated double bond like glycidyl (meth)acrylate or 3,4-epoxycyclohexylmethyl (meth)acrylate, or (meth)acrylic chloride, as a pendant to a copolymer of an unsaturated carboxylic acid such as (meth)acrylic acid with one or more other compounds having an unsaturated double bond;

(3) a carboxylic photosensitive copolymer resin obtained by reacting an unsaturated carboxylic acid such as (meth)acrylic acid with a copolymer of a compound having an epoxy group and an unsaturated double bond, such as glycidyl (meth)acrylate or 3,4-epoxycyclohexylmethyl (meth)acrylate, with one or more other compounds having an unsaturated double bond, and then reacting the resultant secondary hydroxyl group with a polybasic acid anhydride;

(4) a carboxylic photosensitive copolymer resin obtained by reacting a compound having a hydroxyl group and an unsaturated double bond, such as 2-hydroxyethyl (meth)acrylate, with a copolymer of an acid anhydride having an unsaturated double bond, such as maleic anhydride, with other compound having an unsaturated double bond;

(5) a carboxylic photosensitive resin obtained by reacting a polyfunctional epoxy compound with an unsaturated monocarboxylic acid, and then reacting the resultant hydroxyl group with a saturated or unsaturated polybasic acid anhydride;

(6) a photosensitive resin containing hydroxyl and carboxyl groups obtained by reacting a saturated or unsaturated polybasic acid anhydride with a hydroxylic polymer, such as polyvinyl alcohol derivatives, and then reacting the resultant carboxylic acid with a compound having an epoxy group and an unsaturated double bond within one molecule thereof;

(7) a carboxylic photosensitive resin obtained by reacting a saturated or unsaturated polybasic acid anhydride with a reaction product of a polyfunctional epoxy compound, an unsaturated monocarboxylic acid, and a compound containing in one molecule thereof at least one alcoholic hydroxyl group and one reactive group other than the alcoholic hydroxyl group, which reacts with an epoxy group;

(8) a carboxylic photosensitive resin obtained by reacting an unsaturated monocarboxylic acid with a polyfunctional oxetane compound having at least two oxetane rings in one molecule thereof, and then reacting the primary hydroxyl group of the resultant modified oxetane resin with a saturated or unsaturated polybasic acid anhydride; and (9) a carboxylic photosensitive resin obtained by reacting a polyfunctional epoxy resin with an unsaturated monocarboxylic acid, and then with a polybasic acid anhydride to form a carboxylic resin, and then reacting the resin with a compound having one oxirane ring and one or more ethylenically unsaturated groups in the molecule thereof.

Among these examples, the carboxylic photosensitive resins (2) and (3) are preferable from the viewpoint of the photocurability and baking properties.

In the present description, the term "(meth)acrylate" collectively refers to acrylate, methacrylate, and a mixture thereof. This holds true for other similar representation.

The carboxylic resin (A) has many free carboxyl groups in the side chains of the backbone polymer, and thus allows development with a dilute aqueous alkaline solution.

The acid value of the carboxylic resin (A) is from 40 to 200 mg KOH/g, and preferably from 45 to 120 mg KOH/g. If the acid value of the carboxylic resin is less than 40 mg KOH/g, alkaline development becomes difficult. On the other hand, if the acid value is more than 200 mg KOH/g, the exposed areas are dissolved by the developing solution to cause excessive narrowing of lines, or the exposed and unexposed areas may be indiscriminately dissolved and removed by the developing solution, which hinders normal drawing on the resist pattern.

In general, the weight-average molecular weight of the carboxylic resin (A) is preferably from 2,000 to 150,000, and preferably from 5,000 to 100,000, though it varies depending on the skeleton of the resin. If the weight-average molecular weight is less than 2,000, the resultant coating film may be inferior in the tack-free properties and have poor moisture resistance after exposure to light, which may result in the reduction of film thickness during development and striking deterioration of the resolution. On the other hand, if the weight-average molecular weight is more than 150,000, the developability may be very poor, and the storage stability may be inferior.

The content of the carboxylic resin (A) in the whole composition is preferably from 10 to 80% by mass, and more preferably from 15 to 50% by mass. If the content is too low, the strength of the coating film will decrease. On the other hand, if the content is too high, the composition becomes highly viscous to deteriorate in its application properties.

(B) Oxime Ester-Based Photopolymerization Initiator Having an Oxime Ester Group

The photocurable and thermosetting resin composition of the present invention must include the oxime-based photopolymerization initiator (B) having a functional group expressed by the general formula (I).

Examples of such compounds include 1,2-octanedione-1-[4-(phenylthio)-2-(O-benzoyloxime)], ethanone-1-[9-ethyl-6-(2-methylbenzoyl)-9H-carbazole-3-yl]-1-(O-acetyloxime), the compound expressed by the formula (IV), and 2-(acetyloxyiminomethyl)thioxanthene-9-one. Among these compounds, the compounds expressed by the formulae (V) and (IV), ethanone-1-[9-ethyl-6-(2-methylbenzoyl)-9H-carbazole-3-yl]-1-(O-acetyloxime), and 2-(acetyloxyiminomethyl)thioxanthene-9-one are particularly preferable.

Examples of commercial products of the compounds include CGI-325, OXE-02, and OXE-01 manufactured by Ciba Specialty Chemicals.

The content of the oxime-based photopolymerization initiator (B) is preferably from 0.01 to 20 parts by mass, and more preferably from 0.01 to 5 parts by mass with respect to 100 parts by mass of the carboxylic resin (A). If the content of the oxime-based photopolymerization initiator (B) is too low with respect to 100 parts by mass of the carboxylic resin (A), the photocurability will not sufficiently be achieved. On the other hand, if the content is too high, the thick film curability will deteriorate to result in the increase of the production cost.
(C) Photopolymerization Initiator Other than Oxime Ester-Based Photopolymerization Initiator, Such as Phosphine Oxide-Based Photopolymerization Initiator If the oxime ester-based photopolymerization initiator is used alone, it may react with copper atoms at the interface with a copper foil to lose the function as a photopolymerization initiator. The problem is solved by combining the oxime ester-based photopolymerization initiator with other photopolymerization initiator, such as a phosphine oxide-based photopolymerization initiator. Accordingly, in order to improve the thermal stability of the oxime ester-based photopolymerization initiator, the photopolymerization initiator in the photocurable and thermosetting resin composition of the present invention is preferably the combination of the amino acetophenone-based photopolymerization initiator expressed by the general formula (III) and the phosphine oxide-based photopolymerization initiator (C) having the acylphosphine oxide-based photopolymerization initiator functional group expressed by the general formula (IV).

Examples of the photopolymerization initiator (C) other than the oxime ester-based photopolymerization initiator, such as a phosphine oxide-based photopolymerization initiator, include acylphosphine oxide-based photopolymerization initiators such as 2,4,6-trimethylbenzoyl diphenylphosphine oxide, bis(2,4,6-trimethylbenzoyl)-phenylphosphine oxide, and bis(2,6-dimethoxybenzoyl)-2,4,4-trimethyl-pentylphosphine oxide; and α-aminoacetophenone-based photopolymerization initiators such as 2-methyl-1-[4-(methylthio)phenyl]-2-morpholinopropane-1-one and 2-benzyl-2-dimethylamino-1-(4-morpholinophenyl)-butanone-1. Examples of commercial products include LUCIRIN TPO manufactured by BASF, and IRGACURE-819, 907, IRGACURE-369, and IRGACURE-379 manufactured by Ciba Specialty Chemicals.

The content of the photopolymerization initiator (C) other than the oxime ester-based photopolymerization initiator, such as a phosphine oxide-based photopolymerization initiator, is 60 parts by mass or less, and preferably 50 parts by mass or less with respect to 100 parts by mass of the carboxylic resin (A). If the content of the photopolymerization initiator (C) other than the oxime ester-based photopolymerization initiator is more than 60 parts by mass, the thick film curability will deteriorate to result in the increase of the production cost.
(Other Photopolymerization Initiator, Photoinitiator Aid, and Sensitizer)

The composition of the present invention may further include, as necessary, a photopolymerization initiator, a photoinitiator aid, and a sensitizer which are known and widely used. Specifically, the composition of the present invention may include a photopolymerization initiator other than the above-described compounds, a photopolymerization initiator aid, and a sensitizer. Examples thereof include benzoin compounds, acetophenone compounds, anthraquinone compounds, thioxanthone compounds, ketal compounds, benzophenone compounds, xanthone compounds, and tertiary amine compounds.

Specific examples of the benzoin compounds include benzoin, benzoin methyl ether, benzoin ethyl ether, and benzoin isopropyl ether.

Specific examples of the acetophenone compounds include acetophenone, 2,2-dimethoxy-2-phenylacetophenone, 2,2-diethoxy-2-phenylacetophenone, and 1,1-dichloroacetophenone.

Specific examples of the anthraquinone compounds include 2-methylanthraquinone, 2-ethylanthraquinone, 2-t-butylanthraquinone, and 1-chloroanthraquinone.

Specific examples of the thioxanthone compounds include 2,4-dimethylthioxanthone, 2,4-diethylthioxanthone, 2-chlorothioxanthone, and 2,4-diisopropylthioxanthone.

Specific examples of the ketal compounds include acetophenone dimethyl ketal, and benzyl dimethyl ketal.

Specific examples of the benzophenone compounds include benzophenone, 4-benzoyldiphenyl sulfide, 4-benzoyl-4'-methyldiphenyl sulfide, 4-benzoyl-4'-ethyldiphenyl sulfide, and 4-benzoyl-4'-propyldiphenyl sulfide.

Specific examples of the tertiary amine compounds include ethanolamine compounds, compounds having a dialkyl aminobenzene structure, for example, dialkylaminobenzophenone such as 4,4'-dimethylaminobenzophenone (NISSO CURE, MABP manufactured by Nippon Soda Co., Ltd.) and 4,4'-diethylaminobenzophenone (EAB, manufactured by Hodogaya Chemical Co., Ltd.), dialkylamino group-containing coumarin compounds such as 7-(diethylamino)-4-methyl-2H-1-benzopyran-2-one-(7-(diethylamino)-4-methyl-coumarin), ethyl 4-dimethylaminobenzoate (KAYACURE EPA, manufactured by Nippon Kayaku Co., Ltd.), ethyl 2-dimethylaminobenzoate (Quantacure DMB, manufactured by International Biosynthetic Inc.), (n-butoxy)ethyl 4-dimethylaminobenzoate (Quantacure BEA, manufactured by the international Biosynthetic Inc.), isoamylethyl p-dimethylaminobenzoate (Kaya Cure DMBI manufactured by Nippon Kayaku Co., Ltd.), 2-ethylhexyl 4-dimethylaminobenzoate (Esolol 507, manufactured by Van Dyk GmbH), and 4,4'-diethylaminobenzophenone (EAB manufactured by Hodogaya Chemical Co., Ltd.).

Among them, thioxanthone compounds and tertiary amine compounds are preferable. The inclusion of a thioxanthone compound is preferable from the viewpoint of the deep curability. Among the thioxanthone compounds, 2,4-dimethylthioxanthone, 2,4-diethylthioxanthone, 2-chlorothioxanthone, and 2,4-diisopropylthioxane are preferable.

The content of the thioxanthone compound is preferably 20 parts by mass or less, and more preferably 10 parts by mass or less with respect to 100 parts by mass of the carboxylic photosensitive resin (A). If the content of the thioxanthone compound is too high, the thick film curability will deteriorate to result in the increase of the production cost.

The tertiary amine compound preferably has a dialkylaminobenzene structure. Among such compounds, dialkylaminobenzophenone compounds and dialkylamino group-containing coumarin compounds having a maximum absorption wavelength of 350 to 410 nm are particularly preferable. The dialkylaminobenzophenone compound is preferably 4,4'-diethylaminobenzophenone having low toxicity. The dialkylamino group-containing coumarin compound having a maximum absorption wavelength of 350 to 410 mm has a maximum absorption wavelength within the ultraviolet light region, so that it is little colored, and is useful for producing a colorless and transparent photosensitive composition, and a colored solder resist film showing the intrinsic color of the color pigment used. 7-(diethylamino)-4-methyl-2H-1-benzopyran-2-one is particularly preferable because it exhibits an excellent sensitizing effect upon irradiation with a laser beam having a wavelength of 400 to 410 nm.

The content of the tertiary amine compound is preferably from 0.1 to 20 parts by mass, and more preferably from 0.1 to 10 parts by mass with respect to 100 parts by mass of the carboxylic photosensitive resin (A). If the content of the tertiary amine compound is less than 0.1 parts by mass, the sensitizing effect may not be sufficiently achieved. If the content is more than 20 parts by mass, the tertiary amine compound markedly absorbs light on the surface of the dry solder resist coating film, which may result in the deterioration of the deep curability.

The photopolymerization initiator, photopolymerization initiator aid, and sensitizer may be used alone or in combination of two or more thereof.

The total amount of the photopolymerization initiator, photopolymerization initiator aid, and sensitizer is preferably 35 parts by mass or less with respect to 100 parts by mass of the carboxylic photosensitive resin (A). If the amount is more than 35 parts by mass, optical absorption by these agents may degrade the deep curability.

(D) Compound Having Two or More Ethylenically Unsaturated Groups in One Molecule Thereof.

The compound having two or more ethylenically unsaturated groups within one molecule thereof used in the photocurable and thermosetting resin composition of the present invention is photocurable by irradiation with an active energy beam, and insolubilizes or helps to insolubilize the carboxylic resin (A) containing ethylenically unsaturated groups in an aqueous alkaline solution. Examples of the compound include: diacrylates of glycols such as ethylene glycol, methoxytetraethylene glycol, polyethylene glycol, and propylene glycol; polyvalent acrylates of polyhydric alcohols such as hexanediol, trimethylolpropane, pentaerythritol, dipentaerythritol, and tris-hydroxyethyl isocyanurate, and ethylene oxide adducts or propylene oxide adducts thereof; polyvalent acrylates such as phenoxy acrylate, bisphenol A diacrylate, and ethylene oxide adducts or propylene oxide adducts of these phenols; polyvalent acrylates of glycidyl ethers such as glycerol diglycidyl ether, glycerol triglycidyl ether, trimethylolpropane triglycidyl ether, and triglycidyl isocyanurate; and melamine acrylate, and/or methacrylates corresponding to the acrylates.

Other examples include epoxy acrylate resins obtained by reacting a polyfunctional epoxy resin such as a cresol novolac-type epoxy resin with acrylic acid, and epoxy urethane acrylate compounds obtained by reacting the hydroxy groups of the epoxy acrylate resin with a half urethane compound composed of a hydroxy acrylate such as pentaerythritol triacrylate and a diisocyanate such as isophorone diisocyanate. The epoxy acrylate-based resin improves photocurability without deteriorating the dry tack.

The content of the compound (D) having two or more ethylenically unsaturated groups within one molecule thereof is from 5 to 100 parts by mass, and more preferably from 1 to 70 parts by mass with respect to 100 parts by mass of the carboxylic resin (A) containing ethylenically unsaturated groups. If the content is less than 5 parts by mass, the photocurability deteriorates, which hinders the pattern formation by alkali development after irradiation with an active energy beam. On the other hand, if the content is more than 100 parts by mass, the solubility in an aqueous alkaline solution deteriorates, and the coating film becomes brittle.

(E) Sulfur Compound Expressed by the General Formula (II)

The sulfur compound expressed by the general formula (II) may be the compound expressed by the formula (VII):

[Chem 6]

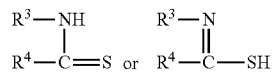

(VII)

wherein, $R^3$ represents an alkyl group, an aryl group, or a substituted aryl group, $R^4$ represents a hydrogen atom or an alkyl group. The $R^3$ and $R^4$ represent a nonmetal atom group to be linked together to form a 5-membered or 7-membered ring which may contain a hetero atom selected from an oxygen, sulfur, and nitrogen atom.

These sulfur compounds are tautomers, and may have a SH group or a NH group. In the present invention, the interaction with the carboxylic resin is considered to stabilize the NH group (base). The SH group is highly reactive with copper and thus hinders development, but the NH group is inactive to copper and will not degrade the developability.

Examples of the sulfur compound (E) include mercaptobenzothiazole, 3-mercapto-4-methyl-4H-1,2,4-triazole, 5-methyl-1,3,4-thiadiazole-2-thiol, and 1-phenyl-5-mercapto-1H-tetrazole.

(Filler)

In the present invention, a known and widely used inorganic or organic filler may be used. In particular, barium sulfate and spherical silica are preferable. Other examples include the compound (D) having two or more ethylenically unsaturated groups within one molecule thereof, and commercial products composed of nanosilica dispersed in the below-described polyfunctional epoxy resin (F-1), such as, NANOCRYL (trade name) XP 0396, XP 0596, XP 0733, XP 0746, XP 0765, XP 0768, XP 0953, XP 0954, XP 1045 (product grade) manufactured by Hanse-Chemie, and NANOPOX (trade name) XP 0516, XP 0525, and XP 0314 (product grade) manufactured by Hanse-Chemie.

These fillers may be used alone or in combination of two or more thereof. These fillers are used to suppress shrinkage on curing of the coating film, improve the fundamental properties such as adhesiveness and hardness, and reduce the hindrance in light reflection or refraction during passage of the active energy beam through the photocurable resin composition.

The content of these fillers is from 0.1 to 300 parts by mass, and more preferably 0.1 to 150 parts by mass with respect to 100 parts by mass of the carboxylic resin (A). If the content of the filler is too low, the properties of the cured coating film such as solder heat resistance and gold plating resistance deteriorate. On the other hand, if the content is too high, the composition becomes highly viscous, which may result in the deterioration in the printing properties and embrittlement of the cured product.

Thermosetting Component (G)

The composition of the present invention may contain a thermosetting component. Examples of the thermosetting component used in the present invention include known and widely used thermosetting resins such as amino resins including melamine resins and benzoguanamine resins, block isocyanate compounds, cyclocarbonate compounds, polyfunctional epoxy compounds, polyfunctional oxetane compounds, and episulphide resins. Among these resins, particularly preferable are thermosetting components having two or more cyclic ether groups and/or cyclic thioether groups within one molecule thereof (hereinafter referred to as cyclic (thio)ether compound), such as the polyfunctional epoxy compound (G-1), polyfunctional oxetane compound (G-2), and episulphide resins.

Examples of the polyfunctional epoxy compound (G-1) include, but not limited to, bisphenol A-type epoxy resins such as EPICOAT 828, EPICOAT 834, EPICOAT 1001, and EPICOAT 1004 manufactured by Japan Epoxy Resins Co., Ltd., EPICLON 840, EPICLON 850, EPICLON 1050, and EPICLON 2055 manufactured by Dainippon Ink And Chemicals, Incorporated, EPOTOHTO YD-011, YD-013, YD-127, and YD-128 manufactured by Tohto Kasei Co., Ltd., D.E.R. 317, D.E.R. 331, D.E.R. 661, and D.E.R. 664 manufactured by Dow Chemical, ARALDITE 6071, ARALDITE 6084, ARALDITE GY250, and ARALDITE GY260 manufactured by Ciba Specialty Chemicals, SUMI-EPOXY ESA-011, ESA-014, ELA-115, and ELA-128 manufactured by Sumitomo Chemical Co., Ltd., and A.E.R. 330, A.E.R. 331, A.E.R. 661, and A.E.R. 664 manufactured by Asahi Chemical Industry Co., Ltd. (all trade names); brominated epoxy resins such as EPICOAT YL903 manufactured by Japan Epoxy Resins Co., Ltd., EPICLON 152 and EPICLON 165 manufactured by Dainippon Ink And Chemicals, EPOTOHTO YDB-400 and YDB-500 manufactured by Tohto Kasei Co., Ltd., D.E.R. 542 manufactured by Dow Chemical, ARALDITE 8011 manufactured by Ciba Specialty Chemicals, SUMI-EPOXY ESB-400 and ESB-700 manufactured by Sumitomo Chemical Co., Ltd., A.E.R. 711 and A.E.R. 714 manufactured by Asahi Chemical Industry Co., Ltd. (all trade names); novolac-type epoxy resins such as EPICOAT 152 and EPICOAT 154 manufactured by Japan Epoxy Resins Co., Ltd., D.E.N. 431 and D.E.N. 438 manufactured by Dow Chemical, EPICLON N-730, EPICLON N-770, and EPICLON N-865 manufactured by Dainippon Ink And Chemicals, Incorporated, EPOTOHTO YDCN-701 and YDCN-704 manufactured by Tohto Kasei Co., Ltd., ARALDITE ECN1235, ARALDITE ECN1273, ARALDITE ECN1299, and ARALDITE XPY307 manufactured by Ciba Specialty Chemicals, EPPN-201, EOCN-1025, EOCN-1020, EOCN-104S, and RE-306 manufactured by Nippon Kayaku Co., Ltd., SUMI-EPOXY ESCN-195× and ESCN-220 manufactured by Sumitomo Chemical Co., Ltd., and A.E.R. ECN-235 and ECN-299 manufactured by Asahi Chemical Industry Co., Ltd. (all trade names); bisphenol F-type epoxy resins such as EPICLON 830 manufactured by Dainippon Ink And Chemicals, Incorporated, EPICOAT 807 manufactured by Japan Epoxy Resins Co., Ltd., EPOTOHTO YDF-170, YDF-175, and YDF-2004 manufactured by Tohto Kasei Co., Ltd., and ARALDITE XPY306 manufactured by Ciba Specialty Chemicals (all trade names); hydrogenated bisphenol A-type epoxy resins such as EPOTOHTO ST-2004, ST-2007, and ST-3000 (trade names) manufactured by Tohto Kasei Co., Ltd.; glycidyl amine-type epoxy resins such as EPICOAT 604 manufactured by Japan Epoxy Resins Co., Ltd., EPOTOHTO YH-434 manufactured by Tohto Kasei Co., Ltd., ARALDITE MY720 manufactured by Ciba Specialty Chemicals, and SUMI-EPOXY ELM-120 manufactured by Sumitomo Chemical Co., Ltd. (all trade names); hydantoin-type epoxy resins such as ARALDITE CY-350 (trade name) manufactured by Ciba Specialty Chemicals; alicyclic epoxy resins such as CELLOXIDE 2021 manufactured by Daicel Chemical Industries, Ltd., and ARALDITE CY175 and CY179 manufactured by Ciba Specialty Chemicals (all trade names); trihydroxyphenyl methane-type epoxy resins such as YL-933 manufactured by Japan Epoxy Resins Co., Ltd., and T.E.N., EPPN-501, and EPPN-502 manufactured by Dow Chemical (all trade names); bixylenol-type or biphenol-type epoxy resins such as YL-6056, YX-4000, YL-6121 (all trade names) manufactured by Japan Epoxy Resins Co., Ltd., and mixtures thereof; bisphenol S-type epoxy resins such as EBPS-200 manufactured by Nippon Kayaku Co., Ltd., EPX-30 manufactured by Asahi Denka Company Limited, and EXA-1514 (trade name) manufactured by Dainippon Ink And Chemicals, Incorporated; bisphenol A novolac-type epoxy resins such as EPICOAT 157S (trade name) manufactured by Japan Epoxy Resins Co., Ltd.; tetraphenylolethane-type epoxy resins such as EPICOAT YL-931 manufactured by Japan Epoxy Resins Co., Ltd., and ARALDITE 163 manufactured by Ciba Specialty Chemicals (all trade names); heterocyclic epoxy resins such as ARALDITE PT810 manufactured by Ciba Specialty Chemicals, and TEPIC manufactured by Nissan Chemical Industries, Ltd. (all trade names); diglycidyl phthalate resins such as BLEMMER DGT manufactured by N of Corporation; tetraglycidylxylenoylethane resins such as ZX-1063 manufactured by Tohto Kasei Co., Ltd.; naphthalene group-containing epoxy resins such as ESN-190 and ESN-360 manufactured by Nippon Steel Chemical Co., Ltd., and HP-4032, EXA-4750, and EXA-4700 manufactured by Dainippon Ink And Chemicals, Incorporated; epoxy resins having a dicyclopentadiene skeleton, such as HP-7200 and HP-7200H manufactured by Dainippon Ink And Chemicals, Incorporated; glycidyl metaacrylate copolymer-based epoxy resin such as CP-50S and CP-50M manufactured by N of Corporation; cyclohexyl maleimide-glycidyl metaacrylate copolymer epoxy resins; and epoxy-modified polybutadiene rubber derivatives such as PB-3600 manufactured by Daicel Chemical Industries, Ltd., and CTBN-modified epoxy resins such as YR-102 and YR-450 manufactured by Tohto Kasei Co., Ltd. These epoxy resins may be used alone or in combination of two or more thereof. Among these resins, novolac-type epoxy resins, heterocyclic epoxy resins, bisphenol A-type epoxy resins, and mixtures thereof are particularly preferable.

Examples of the polyfunctional oxetane compound (G-2) include polyfunctional oxetanes such as bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl) methyl acrylate, (3-ethyl-3-oxetanyl)methyl acrylate, (3-methyl-3-oxetanyl)methyl methacrylate, (3-ethyl-3-oxetanyl)methyl methacrylate, and oligomers or copolymers thereof, ethers of oxetane with hydroxylic resins such as novolac resins, poly(p-hydroxystyrene), cardo-type bisphenols, calixarenes, calix resorcin allenes, and silsesquioxane. Other examples include copolymers of oxetane ring-containing unsaturated monomers and alkyl (meth)acrylate.

Examples of the compound having two or more cyclic thioether groups within one molecule thereof include bisphenol A-type episulphide resin YL7000 manufactured by Japan Epoxy Resins Co., Ltd. Other examples include episulphide resins synthesized by the similar method, wherein the oxygen atoms in the epoxy groups of the novolac-type epoxy resins are substituted with sulfur atoms.

The content of the cyclic (thio)ether compound is from 0.6 to 2.0 equivalent, and preferably from 0.8 to 1.5 equivalent in terms of the cyclic (thio)ether groups with respect to 1 equivalent of the carboxyl groups in the carboxylic resin containing ethylenically unsaturated groups. If the content of the cyclic (thio)ether compound is less than the above-described range, carboxyl groups remain to degrade the thermal resistance, alkaline resistance, and electrical insulation. On the other hand, if the content is more than the above-described range, low molecular weight cyclic (thio)ether groups remain to degrade the strength of the coating film and other properties.
(Thermosetting Catalyst)

When the cyclic (thio)ether compound is used as the thermosetting component, the composition of the present invention preferably contains a thermosetting catalyst. Examples of the thermosetting catalyst include imidazole and imidazole derivatives such as 2-methylimidazole, 2-ethylimidazole, 2-ethyl-4-methylimidazole, 2-phenylimidazole, 4-phenyl imidazole, 1-cyano ethyl-2-phenyl imidazole, and 1-(2-cyanoethyl)-2-ethyl-4-methylimidazole; amine compounds such as dicyan diamide, benzyldimethylamine, 4-(dimethylamino)-N,N-dimethylbenzyl amine, 4-methoxy-N,N-dimethylbenzylamine, and 4-methyl-N,N-dimethylbenzylamine; hydrazine compounds such as adipoyl dihydrazide, and sebacic dihydrazide; and phosphorus compounds such as triphenylphosphine. Examples of commercial products include 2MZ-A, 2MZ-OK, 2PHZ, 2P4BHZ, and 2P4 MHZ (all trade names for imidazole-based compounds) manufactured by Shikoku Chemicals Corporation, U-CAT3503N and U-CAT3502T (both trade names for dimethylamine block isocyanate compounds), DBU, DBN, U-CATSA102, and U-CAT5002 (all trade names for dicyclic amidine compounds and salts thereof) manufactured by San-Apro Ltd. The catalyst is not limited to these examples, and may be a thermosetting catalyst such as an epoxy resin or oxetane compound, or a substance which accelerates the reaction between an epoxy group and/or oxetanyl group and a carboxyl group. These catalysts may be used alone or in combination of two or more thereof. The composition may contain a compound which serves as a tackifier. Examples of such compound include guanamine, acetoguanamine, benzoguanamine, melamine, and S-triazine derivatives such as 2,4-diamino-6-methacryloyloxyethyl-S-triazine, 2-vinyl-4,6-diamino-S-triazine, 2-vinyl-4,6-diamino-S-triazine-isocyanuric acid adduct, and 2,4-diamino-6-methacryloyloxyethyl-S-triazine-isocyanuric acid adduct. It is preferable that the thermosetting catalyst be combined with the compound which serves as a tackifier.

The content of the thermosetting catalyst may be at a normal level. For example, the content is preferably from 0.1 to 20 parts by mass, and more preferably from 0.5 to 15.0 parts by mass with respect to 100 parts by mass of the carboxylic resin (A) containing ethylenically unsaturated groups or the thermosetting component.
(Other Components)

The photocurable and thermosetting resin composition of the present invention may further contain an organic solvent for synthesizing the carboxylic resin (A) containing ethylenically unsaturated groups and adjusting the composition, or for adjusting the viscosity during application to a substrate or carrier film.

Examples of the organic solvent include ketones, aromatic hydrocarbons, glycol ethers, glycol ether acetates, esters, alcohols, aliphatic hydrocarbons, and petroleum solvents. Specific examples thereof include ketones such as methyl ethyl ketone and cyclohexanone; aromatic hydrocarbons such as toluene, xylene, and tetramethylbenzene; glycol ethers such as cellosolve, methylcellosolve, butylcellosolve, carbitol, methyl carbitol, butyl carbitol, propylene glycol monomethyl ether, dipropylene glycol monomethyl ether, dipropylene glycol diethyl ether, and triethylene glycol monoethyl ether; glycol ether acetates such as dipropylene glycol methyl ether acetate, propylene glycol methyl ether acetate, propylene glycol ethyl ether acetate, and propylene glycol butyl ether acetate; esters such as ethyl acetate, butyl acetate, and acetate esters of the above-described glycol ethers; alcohols such as ethanol, propanol, ethylene glycol, and propylene glycol; aliphatic hydrocarbons such as octane and decane; and petroleum solvents such as petroleum ether, petroleum naphtha, hydrogenated petroleum naphtha, and solvent naphtha.

These organic solvents may be used alone or in combination of two or more thereof.

The photocurable and thermosetting resin composition of the present invention may further contain other additives as necessary. Examples thereof include: known and widely used coloring agents such as phthalocyanine blue, phthalocyanine green, iodine green, disazo yellow, crystal violet, titanium oxide, carbon black, and naphthalene black; known and widely used thermal polymerization inhibitors such as hydroquinone, hydroquinone monomethyl ether, t-butyl catechol, pyrogallol, and phenothiazine; known and widely used thickening agents such as fine powder silica, organic bentonite, and montmorillonite; anti-foaming agents and/or leveling agents such as silicone-based, fluorine-based, and polymer-based ones; and silane coupling agents, antioxidants, and rust-preventive agents such as imidazole-based, thiazole-based, and triazole-based ones.
(Usage of the Composition According to the Present Invention)

The photocurable and thermosetting resin composition of the present invention is adjusted to have a viscosity suitable for the application method by, for example, dilution with the organic solvent, applied to a substrate having a circuit by, for example, dip coating, flow coating, roll coating, bar coating, screen printing, or curtain coating, and dried at a temperature of about 60 to 100° C. for evaporating and drying (provisionally drying) the organic solvent contained in the composition to form a tack-free coating film. Alternatively, the composition is applied to a carrier film, dried, and wound in the form of a film, which is then bonded to a substrate having a circuit thereby forming a resin insulating layer. Thereafter, the layer is selectively exposed to an active energy beam by a contact or noncontact process through a photomask having a pattern, and the unexposed areas are developed with a dilute aqueous alkaline solution (for example, 0.3 to 3% sodium carbonate aqueous solution) thereby forming a resist pattern. Furthermore, the layer may be thermally cured by, for example, heating to a temperature of about 140 to 180° C. thereby reacting the carboxyl groups of the carboxylic resin (A) containing ethylenically unsaturated groups with the thermosetting component (G), whereby a cured coating film having excellent properties such as thermal resistance, chemical resistance, moisture absorption resistance, adhesiveness, and electrical properties is formed.

The above-described dry film is bonded to a substrate using a hot roll laminator or the like in such a manner that the photosensitive resin composition layer is in contact with the base material. When the dry film is composed of a film of the photosensitive resin composition and a removable cover film, the cover film is removed, and then the dry film is bonded to a substrate in such a manner that the photosensitive resin composition layer is in contact with the base material.

The base material composing the substrate is, for example, a copper-clad laminate for high frequency circuit composed of, for example, paper phenol, paper epoxy, glass cloth epoxy, glass polyimide, glass cloth/nonwoven fabric epoxy, glass cloth/paper epoxy, synthetic fiber epoxy, or fluorine-polyethylene-PPO-cyanate ester. Examples thereof include copper-clad laminates of all grades (for example, FR-4), and other substrates such as polyimide films, PET films, glass substrates, ceramic substrates, and wafers.

The evaporating and drying following the application of the photocurable and thermosetting resin composition of the present invention may be performed under a system of contacting hot air flowing in the counter direction or blowing hot air through a nozzle onto a substrate in a drying machine equipped with a heat source of an air heating system using steam, for example, a hot air circulating drying oven, an IR oven, a hot plate, or a convection oven.

The photocurable resin composition of the present invention is applied and dried by evaporation as described below, and then the obtained coating film is exposed to light (irradiation with an active energy beam). The exposed areas on the coating film (areas irradiated with the active energy beam) are cured.

The exposure equipment to be used for irradiation with the active energy beam may be a direct imaging apparatus such as a laser direct imaging apparatus which draws an image directly by a laser according to the CAD data from a computer. The active energy beam may be a gas laser beam or solid-state laser beam insofar as the laser beam has a maximum wavelength of 350 to 410 nm. Although the exposure dose varies depending on the film thickness and the like, it may be set generally from 5 to 200 mJ/cm$^2$, preferably from 5 to 100 mJ/cm$^2$, and more preferably from 5 to 80 mJ/cm$^2$. Examples of the direct imaging apparatus include the products manufactured by Orbotech Japan Co., Ltd., PENTAX CORPORATION, Hitachi Via Mechanics, Ltd., and Ball Semiconductor Inc. Other examples include known ultraviolet light exposure equipment.

Examples of the development method include a dipping method, a shower method, a spray method, and a brushing method. Examples of the developing solution include aqueous alkaline solutions of potassium hydroxide, sodium hydroxide, sodium carbonate, potassium carbonate, sodium phosphate, sodium silicate, ammonia, and amines.

EXAMPLES

The present invention will be further illustrated with reference to the following Examples and Comparative Examples, but will not be limited to the following Examples.

Synthesis Example

Into a 2-liter separable flask equipped with a stirrer, a thermometer, a reflux condenser, a dropping funnel, and a nitrogen introduction tube, 660 g of a cresol novolak-type epoxy resin (EOCN-104S, manufactured by Nippon Kayaku Co., Ltd., softening point: 92° C., epoxy equivalent weight: 220), 421.3 g of carbitol acetate, and 180.6 g of solvent naphtha were charged. The mixture was dissolved under heating and stirring at 90° C. The solution was then cooled to 60° C., and 216 g of acrylic acid, 4.0 g of triphenyl phosphine, and 1.3 g of methyl hydroquinone were added to the solution, and allowed to react at 100° C. for 12 hours thereby forming a reaction product having an acid value of 0.2 mg KOH/g. The reaction product was mixed with 241.7 g of tetrahydrophthalic anhydride. The mixture was heated to 90° C. and allowed to react for 6 hours thereby forming a solution of a carboxylic resin (A) having an acid value of 50 mg KOH/g, a double bond equivalent weight (g weight of the resin per 1 mol of unsaturated groups) of 400, and a weight-average molecular weight of 7,000. The solution of the carboxylic resin is hereinafter referred to as "A-1 varnish".

Specific Example

The resin solution obtained in Synthetic Example 1 was mixed with the components listed in Tables 1 and 2 at the ratios listed in the tables (in parts by weight). The mixture was preliminarily mixed with a stirrer, and then kneaded with a three-roll mill thereby producing a photosensitive resin composition for solder resist. The degree of dispersion of the obtained photosensitive resin composition was determined by the grain size measurement with a grindometer manufactured by ERICHSEN GmbH, and was found to be 15 µm or less.

Examples 1 to 8 in Tables 1 and 2 are the compositions of the present invention. Comparative Examples 1 and 4 contain no phosphine oxide-based photopolymerization initiator, Comparative Examples 2 and 5 contain no sulfur compound, and Comparative Example 3 contains a sulfur compound different from the sulfur compound according to the present invention. These Comparative Examples are outside the scope of the present invention.

TABLE 1

Examples and Comparative Examples of solder resists for 355 nm laser

| | Examples | | | | Comparative Examples | | |
|---|---|---|---|---|---|---|---|
| | 1 | 2 | 3 | 4 | 1 | 2 | 3 |
| A-1 varnish | 154 | 154 | 154 | 154 | 154 | 154 | 154 |
| Photopolymerization initiator (B-1)*$^1$ | 1 | — | — | — | 1 | — | 1 |
| Photopolymerization initiator (B-2)*$^2$ | — | 0.2 | 0.5 | 1 | — | 0.5 | — |
| Photopolymerization initiator (C-1)*$^3$ | 1 | 0.5 | 1 | 1 | — | 1 | 1 |
| Sulfur compound (E-1)*$^4$ | 0.3 | 0.3 | 0.3 | 0.3 | 0.3 | — | — |
| Sulfur compound (E-2)*$^5$ | — | — | — | — | — | — | 0.3 |
| Compound (D-1)*$^6$ | 20 | 20 | 20 | 20 | 20 | 20 | 20 |
| Filler*$^7$ | 130 | 130 | 130 | 130 | 130 | 130 | 130 |
| Thermosetting component (G-1)*$^8$ | 15 | 15 | 15 | 15 | 15 | 15 | 15 |
| Thermosetting component (G-2)*$^9$ | 30 | 30 | 30 | 30 | 30 | 30 | 30 |
| Thermosetting catalyst*$^{10}$ | 0.3 | 0.3 | 0.3 | 0.3 | 0.3 | 0.3 | 0.3 |
| Phthalocyanine blue | 0.3 | 0.3 | 0.3 | 0.3 | 0.3 | 0.3 | 0.3 |
| Yellow pigment*$^{11}$ | 0.75 | 0.75 | 0.75 | 0.75 | 0.75 | 0.75 | 0.75 |
| Silicon-based anti-foaming agent | 3 | 3 | 3 | 3 | 3 | 3 | 3 |

TABLE 1-continued

Examples and Comparative Examples of solder resists for 355 nm laser

|  | Examples | | | | Comparative Examples | | |
|---|---|---|---|---|---|---|---|
|  | 1 | 2 | 3 | 4 | 1 | 2 | 3 |
| DPM*[12] | 5 | 5 | 5 | 5 | 5 | 5 | 5 |
| #150*[13] | 5 | 5 | 5 | 5 | 5 | 5 | 5 |

Note
*[1] 2-(acetyloxyiminomethyl)thioxanthene-9-one
*[2] ethanone-1-[9-ethyl-6-(2-methylbenzoyl)-9H-carbazole-3-yl]-1-(O-acetyloxime)
*[3] 2,4,6-trimethylbenzoyl-diphenyl-phosphine oxide
*[4] 2-mercaptobenzothiazole
*[5] Trimethylolpropane tris(3-mercaptopropionate)
*[6] Dipentaerythritol hexaacrylate
*[7] Barium sulfate
*[8] Phenol novolac-type epoxy resin
*[9] Bixylenol-type epoxy resin
*[10] Dicyan diamide
*[11] Anthraquinone-based yellow pigment
*[12] Dipropylene glycol methyl ether acetate
*[13] Aromatic organic solvent (trade name: IPZOLE #150, manufactured by Idemitsu Kosan Co., Ltd.)

TABLE 2

Examples and Comparative Examples of solder resists for 405 nm laser

|  | Examples | | | | Comparative Examples | |
|---|---|---|---|---|---|---|
|  | 5 | 6 | 7 | 8 | 4 | 5 |
| A-1 varnish | 154 | 154 | 154 | 154 | 154 | 154 |
| Photopolymerization initiator (B-1)*[1] | 0.5 | 2 | 2 | 3 | 2 | 1 |
| Photopolymerization initiator (C-1)*[2] | 1 | 6 | 6 | 6 |  | 6 |
| Sensitizer*[3] | 0.1 | 1 |  |  |  | 1 |
| Sensitizer*[4] |  |  | 0.5 |  |  |  |
| Sensitizer*[5] |  |  |  | 1.5 |  |  |
| Sulfur compound (E-1)*[6] | 0.5 | 0.5 | 0.5 | 0.5 | 0.5 | — |
| Compound (D-1)*[7] | 20 | 20 | 20 | 20 | 20 | 20 |
| Filler*[8] | 130 | 130 | 130 | 130 | 130 | 130 |
| Thermosetting component (G-1)*[9] | 15 | 15 | 15 | 15 | 15 | 15 |
| Thermosetting component (G-2)*[10] | 30 | 30 | 30 | 30 | 30 | 30 |
| Thermosetting catalyst*[11] | 0.3 | 0.3 | 0.3 | 0.3 | 0.3 | 0.3 |
| Phthalocyanine blue | 0.3 | 0.3 | 0.3 | 0.3 | 0.3 | 0.3 |
| Yellow pigment*[12] | 0.75 | 0.75 | 0.75 | 0.75 | 0.75 | 0.75 |
| Silicon-based anti-foaming agent | 3 | 3 | 3 | 3 | 3 | 3 |
| DPM*[13] | 5 | 5 | 5 | 5 | 5 | 5 |
| #150*[14] | 5 | 5 | 5 | 5 | 5 | 5 |

Note
*[1] 2-(acetyloxyiminomethyl)thioxanthene-9-one
*[2] 2,4,6-trimethylbenzoyl-diphenyl-phosphine oxide
*[3] 2,4-diethylthioxanthone
*[4] 7-(diethylamino)-4-methyl-2H-1-benzopyran-2-one
*[5] 4,4'-diethylaminobenzophenone
*[6] 2-mercaptobenzothiazole
*[7] Dipentaerythritol hexaacrylate
*[8] Barium sulfate
*[9] Phenol novolac-type epoxy resin
*[10] Bixylenol-type epoxy resin
*[11] Dicyan diamide
*[12] Anthraquinone-based yellow pigment
*[13] Dipropylene glycol methyl ether acetate
*[14] Aromatic organic solvent (trade name: IPZOLE #150, manufactured by Idemitsu Kosan Co., Ltd.)

These photosensitive resin compositions for solder resist were subjected to performance evaluations (deep curability, sectional shape, surface curability, thermal stability, and absorbance) according to the following criteria.

<Deep Curability>

Substrates having a circuit pattern with a line/space ratio of 300/300 and a copper thickness of 35 μm were polished with a buffing roll, washed with water, and dried. Thereafter, each of the photocurable and thermosetting resin compositions of Examples and Comparative Examples prepared as described above was applied to the substrates by a screen printing method. The coating films on the substrates were dried in a hot air circulating drying oven at 80° C. for 30 minutes. After drying, the coating films were exposed to light using a direct imaging apparatus at different wavelengths. The exposure pattern was composed of lines of 20/30/40/50/60/70/80/90/100 μm width drawn in a space area. The irradiation dose of the active energy beam was 40 mJ/cm$^2$ on the photosensitive resin compositions. After exposure to light, the coating films were developed with a 1 mass % aqueous sodium carbonate solution at 30° C. thereby forming a pattern, and then thermally cured at 150° C. for 60 minutes to obtain cured coating films.

The minimum remaining lines on the cured coating films of the photocurable and thermosetting resin compositions were counted using an optical microscope adjusted to 200 magnification. The evaluation results are listed in Tables 3 and 4.

<Sectional Shape>

Substrates having a circuit pattern with a line/space ratio of 300/300 and a copper thickness of 50 μm were polished with a buffing roll, washed with water, and dried. Thereafter, each of the photocurable and thermosetting resin compositions of Examples and Comparative Examples prepared as described above was applied to the substrates by a screen printing method. The coating films on the substrates were dried in a hot air circulating drying oven at 80° C. for 30 minutes. After drying, the coating films were exposed to light using a direct imaging apparatus at different wavelengths. The exposure pattern was composed of lines of 20/30/40/50/60/70/80/90/100 μm width drawn in a space area. The irradiation dose of the active energy beam was 40 mJ/cm$^2$ on the photosensitive resin compositions. After exposure to light, the coating films were developed with an aqueous sodium carbonate solution thereby forming a pattern, irradiated with ultraviolet rays at 1000 mJ/cm$^2$ using a high-pressure mercury lamp, and then thermally cured at 150° C. for 60 minutes to obtain cured coating films. The cross section of the cured coating films taken at the 100 μm line (designed value) was observed.

These shapes were evaluated according to the A-E grade system as shown in the schematic views. The drawings schematically show the following phenomena. In the drawings, reference numbers 1a, 1b, and 1c represent the designed value of the line width, the resin composition after exposure and development, and a substrate, respectively.

In particular, the A grade was given when the deviation from the designed value was not greater than 5 μm at the upper and lower portions of the lines. The evaluation results are listed in Tables 3 and 4.

Grade A: ideal state according to the designed width
Grade B: Shrinkage of the surface layer due to insufficient development resistance or other problem
Grade C: Undercut state
Grade D: Line thickening due to halation or other problem
Grade E: Line thickening on the surface layer and undercut In addition to the grade A, the grades C and D are on the acceptable level for solder resist. On the other hand, those of the grade B have insufficient surface curability, poor appearance and electrical properties. Those of the grade E readily cause peeling of the lines and the undercut portion, and are not usable as solder resists.

<Surface Curability>

Substrates having a circuit pattern with a line/space ratio of 300/300 and a copper thickness of 35 μm were polished with a buffing roll, washed with water, and dried. Thereafter, each of the photocurable and thermosetting resin compositions of Examples and Comparative Examples was applied to the substrates by a screen printing method. The coating films on the substrates were dried in a hot air circulating drying oven at 80° C. for 60 minutes. After drying, the coating films were exposed to light using a direct imaging apparatus at different wavelengths. The exposure pattern was an overall exposure pattern. The irradiation dose of the active energy beam was 40 mJ/cm$^2$ on the photosensitive resin compositions. After exposure to light, the coating films were developed for 60 seconds with a 1 mass % aqueous sodium carbonate solution at 30° C. and 0.2 MPa thereby forming a pattern, and then thermally cured at 150° C. for 60 minutes to obtain cured coating films.

The surface curability of the cured coating films obtained as described above was determined by measuring the glossiness at 60° using a gloss meter, Microtrigloss (manufactured by BYK-Gardner GmbH). Those which exhibited a glossiness of 50 or more after development were evaluated as good, and less than 50 were evaluated as unacceptable. The evaluation results are listed in Tables 3 and 4.

<Thermal Stability>

In the same manner as the above-described surface curability, the presence or absence of peeling of the cured coating films of the photocurable and thermosetting resin compositions of Examples and Comparative Examples on copper was examined using an optical microscope adjusted to 1000 magnification. Those with no peeling were evaluated as good, and those with peeling were evaluated as unacceptable, regardless of the size and number of the peeling area. The evaluation results are listed in Tables 3 and 4.

<Absorbance>

The absorbance was measured using a UV-visible region spectrophotometer (Ubest-V-570DS, manufactured by JASCO Corporation) and an integrating sphere (ISN-470, manufactured by JASCO Corporation). Each of the photocurable and thermosetting resin compositions of Examples 1 to 8 and Comparative Examples 1 to 5 was applied to a glass plate with an applicator, and dried in a hot air circulating drying oven at 80° C. for 30 minutes to form a dried coating film of the photocurable and thermosetting resin composition on the glass plate. Using the UV-visible region spectrophotometer and the integrating sphere, the absorbance base line between 500 and 300 nm was measured with the same glass plate as the glass plate coated with the photocurable and thermosetting resin composition. The absorbance of the glass plate with the dried coating film was also measured, and the absorbance of the dried coating film was calculated from the base line thereby determining the absorbance at the intended wavelengths of 355 and 405 nm. In order to prevent the deviation of absorbance by the deviation of the thickness of the coating film, the thickness of application with the applicator was varied to four stages. The graphs showing the relation between the application thickness and the absorbance at 355 and 405 nm were prepared. The absorbance of the dried coating film of 25 μm thickness was calculated from the approximate equation obtained from the graph, and used as the absorbance of each of the dried coating films. The evaluation results are listed in Tables 3 and 4.

TABLE 3

Evaluation results of solder resist for 355 nm laser

| | | Examples | | | | Comparative Examples | | |
|---|---|---|---|---|---|---|---|---|
| | | 1 | 2 | 3 | 4 | 1 | 2 | 3 |
| Deep curability | Minimum line width μm | 50 | 50 | 50 | 60 | 110 | 120 | Not developable |
| Sectional shape | | A | D | A | C | B | B | |
| Surface curability | 60° glossiness | Good | Good | Good | Good | Unacceptable | Unacceptable | |
| Thermal stability | Peeling on circuit | Good | Good | Good | Good | Unacceptable | Unacceptable | |
| Absorbance | 355 nm, 25 μm thickness | 0.6 | 0.33 | 0.68 | 1.21 | 0.46 | 0.48 | |

TABLE 4

Evaluation results of solder resist for 405 nm laser

| | | Examples | | | | Comparative Examples | |
|---|---|---|---|---|---|---|---|
| | | 5 | 6 | 7 | 8 | 4 | 5 |
| Deep curability | Minimum line width μm | 50 | 30 | 30 | 60 | 100 | 120 |
| Sectional shape | | D | A | A | C | B | B |
| Surface curability | 60° glossiness | Good | Good | Good | Good | Unacceptable | Unacceptable |
| Thermal stability | Peeling on circuit | Good | Good | Good | Good | Unacceptable | Good |
| Absorbance | 405 nm, 25 μm thickness | 0.38 | 0.63 | 0.65 | 1.22 | 0.45 | 0.44 |

Thereafter, the photocurable and thermosetting resin compositions of Examples and Comparative Examples in the tables were applied to copper-clad laminates having a circuit pattern, dried at 80° C. for 30 minutes, and exposed to light at a dose of 20 mJ using EXP-2021 equipped with a high-pressure mercury lamp (manufactured by ORC Manufacturing Co., Ltd.). Subsequently, the coating films were developed with a sodium carbonate aqueous solution in the same manner as the above-described examples to form a pattern, irradiated with ultraviolet rays using a high-pressure mercury lamp at a dose of 1000 mJ/cm$^2$, and then thermally cured at 150° C. for 60 minutes thereby producing printed circuit boards having a solder resist.

These printed circuit boards were subjected to electroless plating treatment at Sakae Denshi Kogyo Co., Ltd., and subjected to peeling test using CELLOTAPE®. As a result of this, the compositions described in Examples 1 to 8 showed no peeling, but Comparative Examples 1 to 5 showed some peeling of lines on thin lines.

These results indicate that the photocurable and thermosetting resin compositions of Examples according to the present invention exhibit high photopolymerization capability upon irradiation with ultraviolet rays or a laser beam, provide sufficient deep curability, and provide excellent surface curability and thermal stability. These photocurable and thermosetting resin compositions are suitable for solder resists requiring electroless gold plating, and laser direct imaging, and can provide printed circuit boards patterned using the compositions.

In particular, the results shown in Table 4 indicate that the photocurable and thermosetting resin composition of the present invention exhibits high photopolymerization capability upon irradiation with a laser beam of 350 to 410 nm, provides sufficient deep curability, and provides excellent surface curability and thermal stability. The photocurable and thermosetting resin composition is suitable for solder resists requiring electroless gold plating, and laser direct imaging with a laser beam of 350 to 410 nm, and can provide printed circuit boards patterned using the composition.

Other Examples

Regarding the solder resists for 355 nm laser listed in Table 1, the photopolymerization initiator (C) in Example 1 was changed to other kind of the photopolymerization initiator (C), and the test was conducted.

The photopolymerization initiator (C) in Example 1 was changed from 1 part of 2,4,6-trimethylbenzoyl-diphenyl-phosphine oxide to 6 parts of Irg907 (manufactured by Ciba Specialty Chemicals), which is an aminoacetophenone-based photopolymerization initiator, and the test was conducted. Almost the same results as Example 1 were obtained. However, the exposure dose of 40 mJ/cm$^2$ was insufficient for preparing the substrate, and the dose of 50 mJ/cm$^2$ was necessary.

Regarding the solder resists for 355 nm laser listed in Table 1, the sulfur compound (D) in Example 1 was changed to a different photopolymerization initiator (D), and the test was conducted.

The sulfur compound (D) in Example 1 was changed from mercaptobenzothiazole to 3-mercapto-4-methyl-4H-1,2,4-triazole, and the test was conducted; the same result as Example was obtained when the exposure dose was 30 mJ/cm$^2$.

The sulfur compound (D) in Example 1 was changed from mercaptobenzothiazole to 5-methyl-1,3,4-thiadiazole-2-thiol, and the test was conducted; the same result as Example was obtained when the exposure dose was 30 mJ/cm².

The sulfur compound (D) in Example 1 was changed from mercaptobenzothiazole to 1-phenyl-5-mercapto-1H-tetrazole, and the test was conducted; the same result as Example was obtained when the exposure dose was 40 mJ/cm².

Next, the test was conducted on a dry film.

The photosensitive resin composition prepared according to Example 1 was diluted with methyl ethyl ketone, applied to a carrier film, and heat-dried at 80° C. for 30 minutes using a hot-air drier thereby forming a photosensitive resin composition layer having a thickness of 20 μm. Subsequently, a cover film was bonded to the layer to produce a dry film. Thereafter, the cover film was removed, the remaining film was thermally laminated to a copper foil substrate having a pattern, and then exposed to light in the same manner as described above. After exposure, the carrier film was removed, and the composition layer was developed with a 1% sodium carbonate aqueous solution at 30° C. for 60 seconds to form a film. Thereafter, the film was thermal cured at 150° C. for 60 minutes using a hot-air drier to produce a test substrate. The test substrate having the cured film was subjected to the evaluations of the properties under the above-described test methods and evaluation methods. The results are the same as Example 1.

What is claimed is:

1. A photocurable and thermosetting resin composition developable with a dilute alkaline solution, comprising:

a carboxylic resin;

a first photopolymerization initiator comprising an oxime ester group expressed by formula (I):

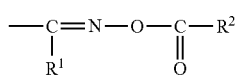

wherein R1 represents a hydrogen atom, an alkyl group having 1 to 7 carbon atoms, or a phenyl group, R2 represents an alkyl group having 1 to 7 carbon atoms, or a phenyl group;

a second photopolymerization initiator;

a compound having two or more ethylenically unsaturated groups within one molecule thereof; and a sulfur compound expressed by formula (II):

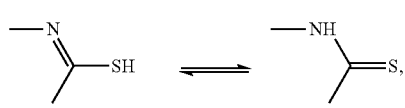

wherein the second photopolymerization initiator comprises one or a mixture of two or more compounds selected from the group consisting of an amino acetophenone-based photopolymerization initiator comprising a structure expressed by formula (III), and an acylphosphine oxide-based photopolymerization initiator expressed by formula (IV):

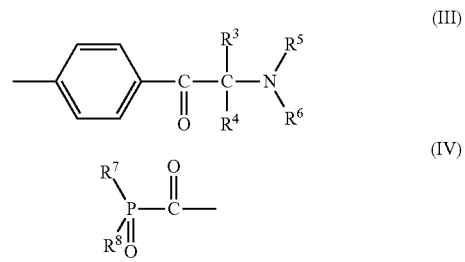

wherein R3 and R4 each independently represent an alkyl group or arylalkyl group having 1 to 12 carbon atoms, R5 and R6 each independently represent a hydrogen atom, an alkyl group having 1 to 6 carbon atoms, or R5 and R6 may be linked together to form a cyclic alkyl ether group, and R7 and R8 each independently represent a linear or branched alkyl group having 1 to 10 carbon atoms, a cyclohexyl group, a cyclopentyl group, an aryl group which may be substituted with a halogen atom, an alkyl group, or an alkoxy group, or R—C(=O)— group wherein R is a hydrocarbon group having 1 to 20 carbon atoms; the case where both of R7 and R8 are R—C(=O)— groups is excluded.

2. The photocurable and thermosetting resin composition according to claim 1, wherein the first photopolymerization initiator is expressed by formula (V):

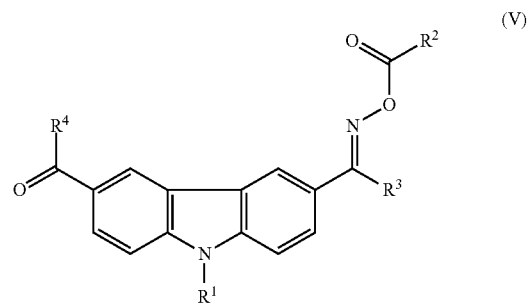

wherein R1 represents an a hydrogen atom, a halogen atom, an alkyl group having 1 to 12 carbon atoms, a cyclopentyl group, a cyclohexyl group, a phenyl group, a benzyl group, a benzoyl group, an alkanoyl group having 2 to 12 carbon atoms, an alkoxycarbonyl group having 2 to 12 carbon atoms (when the alkyl group composing the alkoxyl group has 2 or more carbon atoms, the alkyl group may be substituted with one or more hydroxy groups, and may have one or more oxygen atoms in the alkyl chain), or a phenoxycarbonyl group;

R2 and R4 each independently represent a phenyl group which may be substituted with an alkyl group having 1 to 6 carbon atoms, a phenyl group, or a halogen atom, an alkyl group having 1 to 20 carbon atoms which may be substituted with one or more hydroxy groups, and may have one or more oxygen atoms in the alkyl chain, a cycloalkyl group having 5 to 8 carbon atoms, an alkanoyl group having 2 to 20 carbon atoms, or a benzoyl group which may be substituted with an alkyl group having 1 to 6 carbon atoms or a phenyl group; and R3 represents a hydrogen atom, a phenyl group which may be substituted with an alkyl group having 1 to 6 carbon atoms, a phenyl group, or a halogen atom, an alkyl group having 1 to 20 carbon atoms which may be substituted with one or more hydroxy groups and may have one or more oxygen atoms in the alkyl chain, a cycloalkyl group having 5 to 8 carbon atoms, an alkanoyl group having 2 to 20 carbon atoms, or a benzoyl group which may be substituted with an alkyl group having 1 to 6 carbon atoms or a phenyl group.

3. The photocurable and thermosetting resin composition according to claim 1, wherein the first photopolymerization initiator is expressed by formula (VI):

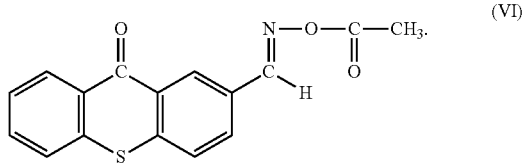

4. The photocurable and thermosetting resin composition according to claim 1, further comprising a thermosetting component.

5. The photocurable and thermosetting resin composition according to claim 1, wherein absorbance per 25 μm thickness of a dry coating film is from 0.4 to 1.2 upon irradiation with a light source.

6. The photocurable and thermosetting resin composition according to claim 1, which is curable with a laser emission source having a maximum wavelength of 350 to 410 nm.

7. A photocurable and thermosetting dry film obtained by applying the photocurable and thermosetting resin composition according to claim 1 to a carrier film, followed by drying.

8. A cured product obtained by optically curing a dry film of the photocurable and thermosetting resin composition according to claim 1 on copper.

9. A cured product obtained by optically curing the dry film according to claim 7 on copper.

10. A cured product obtained by optically curing the photocurable and thermosetting resin composition according to claim 1 with a laser emission source.

11. A cured product obtained by optically curing the dry film according to claim 7 with a laser emission source.

12. A printed circuit board obtained by optically curing the photocurable and thermosetting resin composition according to claim 1 with a laser beam having a maximum wavelength of 350 to 410 nm, and then thermosetting the cured product.

13. A printed circuit board obtained by optically curing the dry film according to claim 7 with a laser beam having a maximum wavelength of 350 to 410 nm, and then thermosetting the cured product.

* * * * *